(12) United States Patent
Pinta et al.

(10) Patent No.: US 10,847,862 B2
(45) Date of Patent: Nov. 24, 2020

(54) HIGH-FREQUENCY SUBSTRATE AND MANUFACTURING METHOD FOR HIGH-PERFORMANCE, HIGH-FREQUENCY APPLICATIONS

(71) Applicant: Rohde & Schwarz GmbH & Co. KG, Munich (DE)

(72) Inventors: Christian Pinta, Munich (DE); Mathias Nagel, Munich (DE); Bertrand Thomas, Rheinbach (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 20 days.

(21) Appl. No.: 16/284,474

(22) Filed: Feb. 25, 2019

(65) Prior Publication Data

US 2020/0067161 A1 Feb. 27, 2020

(30) Foreign Application Priority Data

Aug. 27, 2018 (DE) ........................ 10 2018 120 853

(51) Int. Cl.
  *H01P 11/00* (2006.01)
  *H01P 3/12* (2006.01)
(52) U.S. Cl.
  CPC ............ *H01P 11/003* (2013.01); *H01P 3/121* (2013.01)
(58) Field of Classification Search
  CPC ........ H01P 1/207; H01P 3/121; H01P 11/002; H01P 11/003
  USPC .................................................. 333/208, 246
  See application file for complete search history.

(56) References Cited

U.S. PATENT DOCUMENTS 9,698,459 B2 7/2017 Pinta et al.
2015/0372368 A1* 12/2015 Pinta ........................ H05K 1/02
  343/905

FOREIGN PATENT DOCUMENTS

DE 102013202806 A1 7/2014
KR 20140103787 A * 8/2014

OTHER PUBLICATIONS

Marinov et al., "Laser-assisted ultrathin bare die packaging: a route to a new class of microelectronic devices", Laser-based Micro- and Nano-packaging and Assembly VII, edited by Klotzbach et al., Proc. of SPIE vol. 8608, 86080L © 2013 SPIE (Year: 2013).*
"How are multilayer PCBs made?" of the Amitron document entitled multilayer PCB, Amitron Corp., 2001 Landmeier Road, Elk Grove Village, IL 60007. (Year: 2020).*
Prof. Saraswat, Stanford Univ. EE 311 class note of Spring 2003, (Year: 2003).*
Bass et al., "Ultra-Thin Silicon Chips for Submillimeter-Wave Applications", Fifteenth International Symposium on Space THz Technology, Northampton, MA, Apr. 2004. (Year: 2004).*

* cited by examiner

*Primary Examiner* — Benny T Lee
*Assistant Examiner* — Hafizur Rahman
(74) *Attorney, Agent, or Firm* — Ditthavong & Steiner, P.C.

(57) ABSTRACT

A high-frequency substrate contains a carrier substrate, which has at least one fastening element. The fastening element is deposited on the outer region of the carrier substrate and protrudes over the outer region of the carrier substrate.

17 Claims, 9 Drawing Sheets

HIGH-FREQUENCY SUBSTRATE AND MANUFACTURING METHOD FOR HIGH-PERFORMANCE, HIGH-FREQUENCY APPLICATIONS

PRIORITY

This application claims priority of German patent application DE10 2018 120 853.7 filed on Aug. 27, 2018, which is incorporated by reference herewith.

FIELD OF INVENTION

The invention relates to a high-frequency substrate and a method for manufacturing the high-frequency substrate.

In microwave technology, electromagnetic waves are guided in coaxial cables typically up to a frequency of 110 GHz. Hollow conductors are used as waveguides above this frequency. The signal processing (frequency filtering, frequency multiplication, damping, amplification, mixing, combining (e.g. diplexers)) takes place on substrate-based circuits. To this end, the wave must be coupled in and back out on the substrate. With increasing frequency, especially for the terahertz range (0.1 to 100 THz), the requirements for these substrate-based circuits are higher. In this case, small dimensions, narrower tolerances and very good electric properties are required. Semi-conductor components (or in general non-linear parts) are required for the signal processing steps of multiplication and mixing, which must be integrated accordingly into the substrate-based circuit. The carrier substrate used must be permeable for the intended frequency range, i.e. less damping, since only in this manner can the electromagnetic waves be coupled in on the substrate-based circuit and guided via corresponding lines on the substrate-based circuit inside a hollow conductor. Carrier substrates are required in particular for high-performance microwave applications (high power applications), which have a very high thermal conductivity in order to quickly and efficiently dissipate the heat.

A substrate-based circuit and a method for manufacturing the substrate-based circuit with at least one conductor path arranged on a carrier substrate are known from DE 10 2013 202 806 A1, the conductor path being formed from a structured contact layer. DE 10 2013 202 806 A1 further discloses fastening elements, which are connected to the carrier substrate, in order to provide it with better mechanical stability and to dissipate excess thermal energy to a corresponding heat sink. A carrier substrate is therefore known from the cited document, which is provided with fastening elements in order to increase the stability of the carrier substrate and to also dissipate heat from the carrier substrate, but the fastening elements are arranged in a different plane than the conductor path according to DE 10 2013 202 806 A1.

BACKGROUND OF THE INVENTION

Due to the manufacture of the substrate-based circuit according to DE 10 2013 202 806 A1, the fastening elements are located in a plane below each plane in which the upper side of the carrier substrate is located, whereby a step is formed, which has a height of up to 20 µm. Such a structure of the substrate-based circuit makes the installation process difficult and leads to a less than optimal electric and thermal connection of the connection elements on the carrier substrate. Moreover, a predetermined break point emerges in the region of the edge of the carrier substrate by way of this structure and it is not possible to introduce the surface of the carrier substrate, on which at least one conductor path is applied, centrally into a hollow conductor by means of the fastening elements.

Therefore, there is a need to provide a high-frequency substrate (HF substrate) and a method for manufacturing the high-frequency substrate, the contact layers, which are applied on the carrier substrate, being located in the same plane as or in a superordinate plane to the fastening elements.

The arrangement of fastening elements and contact layers in the same or the superordinate plane enables an optimal electric and thermal connection of the fastening elements to the carrier substrate. Moreover, the installation process is simplified and the potential for error when fitting the HF substrate into a housing, for example into a hollow conductor is reduced. Advantageously, the structure according to the invention avoids breaking the fastening elements in the region of the edge of the carrier substrate and allows the surface of the carrier substrate, on which at least one conductor path is applied, to be introduced centrally into for example a hollow conductor by means of the fastening elements.

The method according to the invention for manufacturing a high-frequency substrate (HF substrate) uses a carrier substrate with at least one fastening element on an outer region of the carrier substrate, the at least one fastening element protruding over the outer region of the carrier substrate. It comprises the method step of introducing the carrier substrate into a cavity in a first base substrate. Moreover, the method according to the invention includes the additional method step of application by means of deposition. In the method step of application by means of deposition, at least one fastening element is fastened on an outer region of the carrier substrate and the first base substrate adjoined thereto.

The outer region preferably has a width of up to 500 µm, particularly preferably of less than 300 µm. In this case, it is particularly advantageous for such a fastening element to be fastened on the outer region of the carrier substrate and protrude over this outer region. Such a fastening by means of deposition ensures that the mechanical stability of the carrier substrate is increased. The carrier substrate can also be designated as a membrane, which has no damping or only very low damping for the frequency range of the high-frequency microwave signal. This is achieved through the selection of the material, preferably diamond (e.g. epsilon r diamond 5.6 and tan delta smaller than 0.001 depending on the frequency range) and through the carrier thickness. Very thin carriers are therefore advantageous.

Moreover, it is advantageous for the at least one fastening element to be applied by a deposition process on the carrier substrate, whereby the fastening element is permanently connected to the carrier substrate in a mechanically stable manner and also enables good thermal contact.

In this case, it is also particularly advantageous for the fastening element to protrude over the outer region of the carrier substrate such that the carrier substrate can be fastened in a hollow conductor, in particular fixedly clamped, via the parts of the fastening element, which protrude over the outer region of the carrier substrate. In this case, the fastening element has the shape of a fastening strip or a fastening fin. The fastening element can also be designated as a so-called beam lead.

The method step of application preferably comprises firstly producing at least one cavity in a surface of the first base substrate. It is also conceivable to introduce a plurality of cavities into the surface of the base substrate. In a further method step of the application, the cavity is or a plurality of cavities are filled with the carrier substrate. More precisely, a carrier substrate is applied in the cavity or the cavities with the aim of completely filling the cavity(ies). In this case, the first base substrate is also provided with the carrier substrate when the carrier substrate is applied into the cavities. This emerges from the application process, although it is not desired to provide the first base substrate with the carrier substrate, but rather to simply fill the cavities. Therefore, excess carrier substrate is removed in a subsequent method step of application such that only the cavity or the cavities in the first base substrate are completely filled with the carrier substrate.

The manufacturing method according to the invention also preferably includes the method step of applying a contact layer on the carrier substrate. At least one conductor path and alternatively or additionally at least one antenna element is formed from the contact layer by structuring the contact layer.

The at least one fastening element is advantageously arranged parallel to the conductor path formed on the carrier substrate and can establish a good ground connection. The fastening element also allows the carrier substrate to also have a very good thermal contact, in addition to high stability.

The carrier substrate is preferably formed from diamond and/or each contact layer and/or the fastening elements consist of gold (Au) or contain at least one defined proportion of gold, which varies depending on the application of the HF substrate.

Advantageously, a carrier substrate made of diamond is very durable, has a low thermal expansion and has very good thermal conductivity. Therefore, thermal energy, which is generated on the substrate, can be quickly dissipated to a heat sink. Diamond is also characterized by high resistance to chemical influences and can thus withstand the different chemical processes during the manufacture of the HF substrate. Diamond also has a high transmission over a wide spectral range and excellent dielectric properties.

The method step of structuring the at least one conductor path and/or the at least one antenna element from the contact layer preferably comprises removing the contact layer with the exception of the part, which forms the at least one conductor path and/or the at least one antenna element. Alternatively or in addition thereto, the contact layer is removed with the exception of the part, which is formed as a support surface of at least one electric component.

However, the method according to the invention is particularly advantageous when the subsequent method steps are carried out. In a further method step, a second base substrate is applied on the first base substrate such that it lies on the at least one fastening element.

In a subsequent, preferred method step, the second base substrate is fixed on the first base substrate by means of an adhesive layer.

Advantageously, the fixed second base substrate increases the mechanical stability of the entire structure and allows mechanical and/or chemical processes to be carried out without damaging the substrate structure.

Advantageously, both the adhesive layer and the second base substrate protect the at least one fastening element and the contact layer against chemical substances, which are used in some method steps when manufacturing the HF substrate according to the invention.

In a further method step, the first base substrate is preferably ablated until just before reaching the carrier substrate and namely until just before reaching the underside of the carrier substrate, i.e. the side, which is facing away from the fastening element.

Advantageously, a mechanical process such as grinding can be used since the entire structure is stabilized by the second base substrate. In order to avoid damaging the carrier substrate due to the grinding, grinding is only carried out until just before reaching the underside of the carrier substrate.

The first base substrate is preferably completely ablated in a subsequent method step, a wet-chemical etching process preferably being used. Advantageously, the high chemical resistance of the carrier substrate made of diamond, but also the protection of the at least one fastening element and the contact layer by the adhesive and the second base substrate, allows the use of etching chemicals without the carrier substrate or fastening element or the contact layer being damaged.

The adhesive layer is ultimately preferably completely removed, a solvent usually being used. The second base substrate is later completely removed.

Advantageously, the last method step results in the HF substrate according to the invention, which has at least one fastening element, which lies in the same plane with the conductor paths and/or antenna elements produced by structured contact layers. This simplifies the installation process and results in improved electric and thermal connection of the fastening elements to the carrier substrate.

An alternative method according to the invention for manufacturing a high-frequency substrate (HF substrate) uses a carrier substrate with at least one fastening element on an outer region of the carrier substrate, the at least one fastening element protruding over the outer region of the carrier substrate. It comprises the method step of applying the carrier substrate on a base substrate.

The alternative method according to the invention also includes the further method steps of structuring the carrier substrate and filling the cavities around the carrier substrate with a resistant layer. Moreover, the alternative method according to the invention includes the additional method step of application by means of deposition. In the method step of application by means of deposition, at least one fastening element is fastened on an outer region of the carrier substrate and the resistant layer adjoined thereto.

The outer region preferably has a width of up to 500 µm, particularly preferably of less than 300 µm. In this case, it is particularly advantageous for such a fastening element to be fastened on the outer region of the carrier substrate and protrude over this outer region. Such fastening by means of deposition ensures that the mechanical stability of the carrier substrate is increased. The carrier substrate can also be designated as a membrane, which has no damping or only very low damping for the frequency range of the high-frequency microwave signal. This is achieved through the selection of the material, preferably diamond (e.g. epsilon r diamond 5.6 and tan delta less than 0.001 depending on the frequency range) and through the carrier thickness. Very thin carriers are therefore advantageous.

Moreover, it is advantageous for the at least one fastening element to be applied on the carrier substrate by a deposition process, whereby it is permanently connected to the carrier substrate in a mechanically stable manner and also enables good thermal contact.

In this case, it is also particularly advantageous for the fastening element to protrude over the outer region of the carrier substrate such that the carrier substrate can be fastened, in particular fixedly clamped, in a hollow conductor via these parts of the fastening element, which protrude over the outer region of the carrier substrate. The method step of structuring the carrier substrate preferably comprises removing the carrier substrate with the exception of the part, which should remain as the carrier substrate.

Advantageously, the part of the carrier substrate to be removed is for example easily ablated by means of a dry-chemical process and therefore the carrier substrate can be easily and very precisely structured.

The alternative method according to the invention preferably also comprises the method step of uncovering the upper side of the carrier substrate from the resistant layer such that the resistant layer and the upper side of the carrier substrate form a planar surface.

Advantageously, the surface of the carrier substrate, which is usually covered with the resistant layer when filling cavities around the carrier substrate, is freed from the undesired resistant layer. A planar surface, which is advantageous for carrying out further method steps, results from planarizing the resistant layer up to the upper side of the carrier substrate.

The alternative manufacturing method according to the invention preferably also comprises the method step of applying a contact layer on the carrier substrate. At least one conductor path and alternatively or additionally at least one antenna element is formed from the contact layer by structuring the contact layer.

Advantageously, the at least one fastening element is arranged parallel to the conductor path formed on the carrier substrate and can establish a good ground connection. The fastening element also means that the carrier substrate has very good thermal contact, in addition to high stability.

The carrier substrate is preferably formed from diamond and/or each contact layer and/or the fastening elements consist of gold (Au) or contain at least one defined proportion of gold, which varies depending on the application of the HF substrate.

Advantageously, a carrier substrate made of diamond is very durable, has a low thermal expansion and has very good thermal conductivity. Therefore, thermal energy, which is generated on the substrate, can be quickly dissipated to a heat sink. Diamond is also characterized by high resistance to chemical influences and can thus withstand the different chemical processes during the manufacture of the HF substrate. Diamond also has a high transmission over a wide spectral range and excellent dielectric properties.

The method step of structuring includes the method step of removing the contact layer with the exception of the part, which forms the at least one conductor path and/or the at least one antenna element. Alternatively or in addition, the contact layer is removed with the exception of the part, which is formed as a support surface of at least one electric component.

In a further method step, the base substrate is preferably ablated until just before reaching the carrier substrate and namely until just before reaching the underside of the carrier substrate, i.e. the side, which is facing away from the fastening element.

Advantageously, a mechanical process such as grinding can be used since the entire structure is stabilized by the applied resistant layer. In order to avoid damaging the carrier substrate due to the grinding of the base substrate, grinding is only carried out until just before reaching the underside of the carrier substrate.

The base substrate is preferably completely ablated in a subsequent method step, a wet-chemical etching process preferably being used. Advantageously, the high chemical resistance of the carrier substrate made of diamond, but also the partial protection of the at least one fastening element and the contact layer by the resistant layer, allows the use of etching chemicals without the carrier substrate or fastening element or the contact layer being damaged.

The resistant layer is ultimately preferably completely removed, a solvent or a plasma incineration method usually being used.

Advantageously, the last method step results in the HF substrate according to the invention, which has at least one fastening element, which lies in the same plane with the conductor paths and/or antenna elements produced by structured contact layers. This simplifies the installation process and results in improved electric and thermal connection of the fastening elements to the carrier substrate.

A further alternative method according to the invention for manufacturing a high-frequency substrate (HF substrate) uses a carrier substrate with at least one fastening element on an outer region of the carrier substrate, the at least one fastening element protruding over the outer region of the carrier substrate. It comprises the method step of applying the carrier substrate on a first base substrate. Moreover, the method includes the method steps of application by means of depositing at least one contact surface on the carrier substrate and structuring the carrier substrate. In a subsequent method step, at least one fastening element is applied on a second base substrate by means of deposition. In a further method step, the at least one contact surface is connected to the at least one fastening element.

Advantageously, separately applying layers on a first base substrate and on a second base substrate enables an optimized manufacturing method since process steps can be carried out in parallel.

The method step of connecting preferably comprises the method step of lying the first base substrate (3) and the second base substrate on top of one another such that the surface of the at least one contact surface of the first base substrate lies on the surface of the at least one fastening element of the second base substrate. In a subsequent method step, the surfaces lying on top of one another are then connected to one another by applying temperature and pressure to the surfaces.

Advantageously, methods for connecting surfaces to be paired by means of temperature and pressure can be easily integrated into a manufacturing process.

All three methods according to the invention allow the high-frequency substrate to be manufactured, which consists of a carrier substrate and at least one fastening element on an outer region of the carrier substrate, the at least one fastening element protruding over the outer region of the carrier substrate.

To better explain the method steps according to the invention, two fastening elements are illustrated in the drawings. However, it is expressly mentioned that the high-frequency substrate according to the invention in the minimum configuration consists of a carrier substrate and at least one fastening element.

Advantageously, the structured contact layers are located in the same plane or at least approximately in the same plane as the fastening elements, which are also called beam leads, which simplifies installation, allows the HF structure to be fitted centrally into a hollow conductor and enables optimal electric and thermal connection of the carrier substrate to a heat sink. Moreover, the fastening elements of the HF structure according to the invention have no predetermined break point in the region of the edges of the carrier substrate.

BRIEF DESCRIPTION OF THE DRAWINGS

Different exemplary embodiments of the invention are described below by way of example with reference to the drawing. Identical objects have the same reference numerals. The corresponding figures of the drawing show in detail.

DETAILED DESCRIPTION OF PREFERRED EMBODIMENTS

For better clarity, the individual process steps and structuring steps, which are required to manufacture the HF substrate according to the invention, are not shown in the following figures in full detail. The structuring steps not shown include, inter alia, applying photoresist or hard masks for lithographic processes, but also applying adhesive layers or solder resist layers.

FIGS. 1A to 1I show the individual method steps of a first exemplary embodiment for manufacturing the HF substrate 1 according to the invention.

Figure 1A:
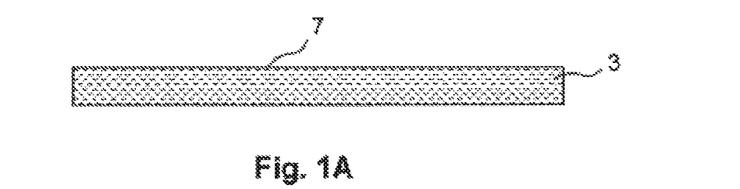
FIG. 1A a first exemplary embodiment for manufacturing the HF substrate according to the invention with a first base structure consisting of a base substrate.

FIG. 1A shows a first base substrate 3, which is required as the starting material, in order to provide the high-frequency (HF) substrate according to the invention. The base substrate 3 consists of a commercial wafer, which is preferably manufactured from silicon (Si). The silicon wafer can be e.g. 2 inches or larger in size.

Figure 1B:
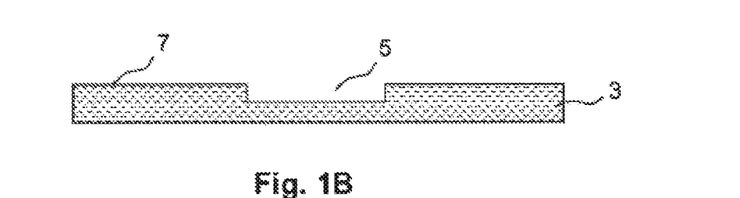
FIG. 1B the base substrate into which a cavity is introduced.

FIG. 1B shows the first base substrate 3 from FIG. 1A, into whose surface 7 at least one cavity 5 is introduced. The cavity 5 is preferably introduced into the first base substrate 3 by means of photolithography and wet-chemical etching steps. The cavity 5 produced usually has a depth, proceeding from the base substrate surface 7 of at least 5 µm to 20 µm.

Figure 1C:
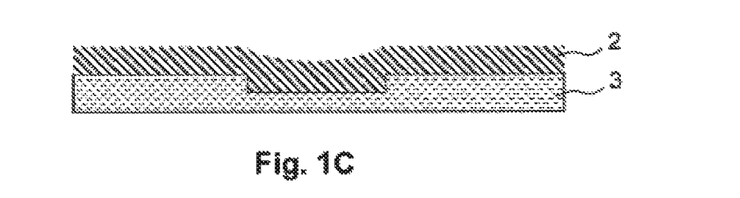
FIG. 1C the base substrate with cavity introduced which is provided with a carrier substrate.

FIG. 1C represents the base substrate 3 with the produced cavity 5, the cavity 5 being coated with a substrate, which forms the carrier substrate 2 of the final HF substrate 1. The carrier substrate 2 is applied for example by a deposition process. The carrier substrate 2 is preferably diamond. The selection of the respective carrier material is especially defined by the specific electric, thermal and mechanical stresses. The surface 7 of the base substrate 3 is also provided with the carrier substrate 2 when the deposition process is carried out. This occurs as part of the deposition process in order to fill the cavity 5 with the carrier substrate 2 and is not desired. The carrier substrate 2 is preferably deposited by means of plasma-enhanced chemical vapor deposition (PECVD). The application of alternative deposition techniques, such as sputtering or vaporization, which belong to physical chemical vapor deposition processes, or another suitable chemical vapor deposition process (CVD process) is conceivable.

Figure 1D:
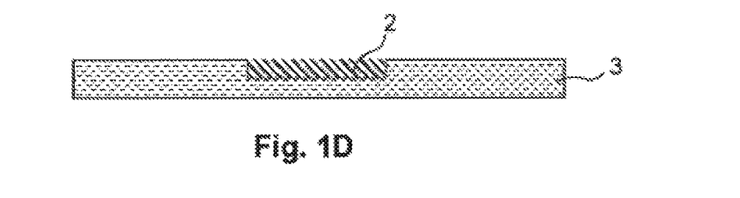
FIG. 1D the base substrate, which is planarized such that the surface of the carrier substrate, which is introduced into the cavity of the base substrate, forms a plane with the surface of the base substrate.

FIG. 1D shows the base substrate 3, which is filled exclusively in the cavity 5 with carrier substrate 2. The structure according to FIG. 1D is produced by excess carrier substrate 2, as still present in FIG. 1C, being ablated by means of suitable processes such that only the cavity 5 is ultimately filled with the carrier substrate 2. One suitable process is for example chemical mechanical polishing (CMP). In the case of this method, a chemical sludge is used equally as the etching means and as the grinding means, which allows the treated surface to be planarized.

Figure 1E:
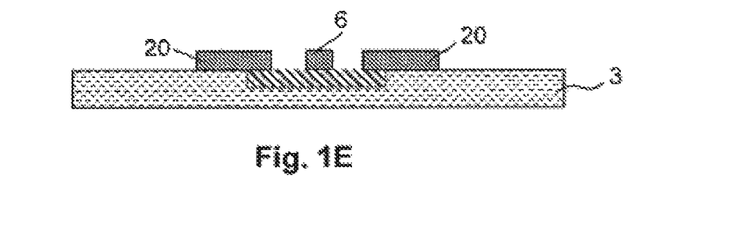
FIG. 1E the structure according to FIG. 1D, in the case of which a contact layer is applied on the carrier substrate, and in the case of which fastening elements are deposited on an outer region of the carrier substrate and base substrate adjoined thereto.

FIG. 1E shows a structured contact layer 6 applied on the carrier substrate 2, which is located inside the cavity 5, said contact layer preferably consisting of gold (Au). Structured contact layer 6 means in the context of this application that a contact layer 6, which is applied on the entire surface of the structure according to FIG. 1D (not represented), is removed with the exception of the part, which should form at least one conductor path and/or an antenna element.

The contact layer 6 can also be structured such that at least one part of the contact layer 6 is formed as the support surface to receive an electronic component. Therefore, any desired circuit with conductor paths, antenna elements, contact surfaces for parts and further structures for carrying out signal processing processes for microwave applications can be implemented on the carrier substrate.

Moreover, fastening elements 20 are represented in FIG. 1E, which also preferably consist of gold (Au) and are for example produced by structuring a contact layer 6. Structuring in relation to the fastening elements 20 and in the context of this application means that the contact layer, which is applied on the entire surface of the structure according to FIG. 1D (not represented), is removed with the exception of the part, which should form at least one fastening element 20, and a conductor path and/or antenna element. The part, which should form the fastening element 20, is formed on an outer region of the carrier substrate 2 and is continued over the outer region of the carrier substrate 2 and is also formed at the adjoining region of the carrier substrate 2 on the base substrate surface 7.

It is also conceivable, instead of completely metallizing a surface, and removing the undesired metallic surfaces, for example by an etching process, to apply the fastening elements 20 and alternatively or additionally structured contact layer 6 by means of additive processes, preferably by galvanization processes.

The thickness of the contact layer 6 is e.g. 100 nm up to 500 nm. The thickness of the carrier substrate 2 is preferably 1 μm to 20 μm, further preferably 5 μm to 20 μm. The carrier substrate 2 is therefore notably thinner than the normal ceramic circuit carriers or the individual layers of a circuit board, which consist of individual films adhered to one another in each case.

The HF substrate 1 itself according to the invention can take any shape. Conceivable shapes are e.g. rectangular, square or L-shaped formations, however, circular or elliptical segments are also implementable. There are also no limits to length and width of the HF substrate 1, which is subsequently formed from the carrier substrate 2 and at least one fastening element 20 and at least one contact element 6.

Figure 1F:
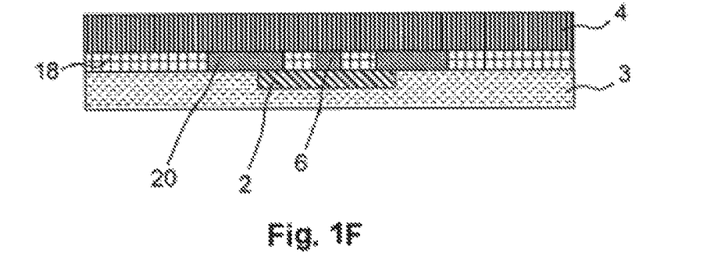
FIG. 1F the structure according to FIG. 1E on which a second base substrate is fixed by an adhesive layer.

FIG. 1F, in addition to the structure represented in FIG. 1E, shows an adhesive layer 18, which is applied on the surface 7 of the base substrate 3. The adhesive layer 18 can also optionally be applied on the surface of the carrier substrate 2, where there is no contact layer present. The adhesive layer 18 is applied such that the surface of the adhesive layer 18 forms a plane with the surfaces of the fastening elements 20 and the contact layer 6.

Lastly, as represented in FIG. 1F, a second base substrate 4 is placed on the adhesive layer 18 and on the surface of the fastening elements 20, as well as on the contact layer 6 and is fixed to the first base substrate 3 by means of the adhesive layer 18. The adhesive layer is preferably resistant to wet-chemical process, which are used in a subsequent method step to remove the first base substrate 3.

Figure 1G:
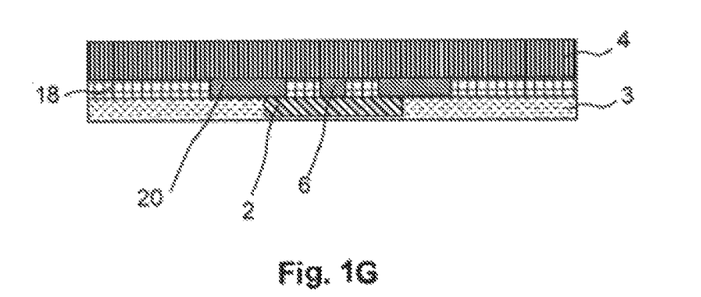
FIG. 1G the structure according to FIG. 1F in the case of which the first base substrate is ablated until just before the surface of the carrier substrate.

FIG. 1G is roughly identical to the representation in FIG. 1F. However, FIG. 1G shows that planar ablation of the first base substrate 3 is carried out until just before the surface of the carrier substrate 2. Ablation until just before the surface of the carrier substrate is preferably carried out by means of a mechanical process, for example by grinding the first base substrate layer 3. In order to avoid damaging the carrier substrate 2, ablation is not carried out all the way to the carrier substrate 2.

For example, the planar ablation operation is stopped a few micrometers, preferably 1 to 20 μm before reaching the carrier substrate layer.

Figure 1H:
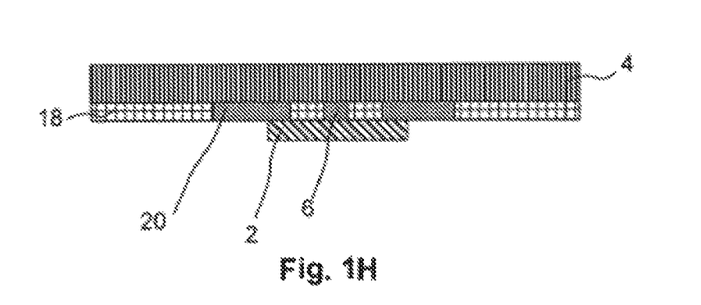
FIG. 1H the structure according to FIG. 1G in the case of which the first base substrate is completely removed.

FIG. 1H shows the resulting substrate structure after completely removing the first base substrate. The remainder of the first base substrate after mechanical ablation according to FIG. 1G is now removed by means of a wet-chemical etching process. In order to avoid damaging the fastening elements 20 or the contact layer 6, the adhesive layer 18 consists of a material, which is resistant to such wet-chemical etching processes.

Figure 1I:
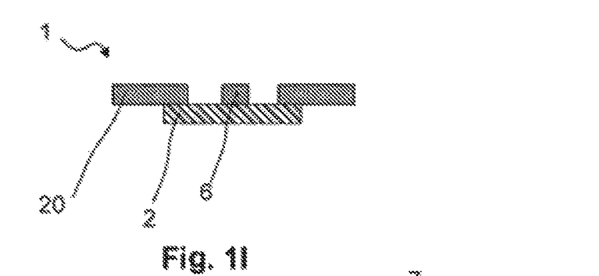
FIG. 1I the structure according to FIG. 1H in the case of which the adhesive layer and the second base substrate are removed, whereby the HF substrate according to the invention is ultimately formed.

FIG. 1I lastly shows the HF substrate 1 according to the invention consisting of a carrier substrate 2, with two fastening elements 20 and at least one contact layer 6. This HF substrate 1 is obtained from the structure according to FIG. 1H by the adhesive layer 18 being dissolved for example by means of a dissolution process or by using a solvent. After removing the adhesive layer 18, the second base substrate 4 is ultimately removed. In order to avoid any possible damage when removing the second base substrate 4 or to simplify the removal of the second base substrate, it is conceivable not to apply any adhesive layer 18 within the divides or cavities, which are formed between the fastening elements 20 and the contact element 6.

The FIGS. 2A to 2H show the individual method steps for manufacturing the HF substrate 50 according to the invention in accordance with a second exemplary embodiment.

It should be expressly mentioned once again that the final HF substrate 50 is identical to the HF substrate 1. Only the alternative method steps for manufacturing the HF substrate 50 differ from the method steps for manufacturing the HF substrate 1.

Figure 2A:
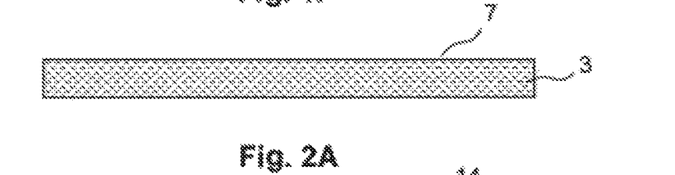
FIG. 2A a second exemplary embodiment for the alternative manufacture of the HF substrate according to the invention with a base structure consisting of a base substrate.

FIG. 2A shows a base substrate 3, which is used to provide the high-frequency (HF) substrate 50 according to the invention. The base substrate 3 consists of a commercial wafer, which is preferably manufactured from silicon (Si). The silicon wafer can be e.g. 2 inches or larger in size.

Figure 2B:
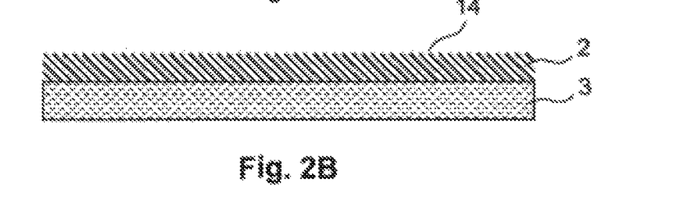
FIG. 2B the base substrate with applied, planarized carrier substrate.

FIG. 2B shows the base substrate 3 from FIG. 2A on whose surface 7 a layer of a carrier substrate 2 is applied. A preferably used deposition technique for applying the carrier substrate 2 is for example plasma-enhanced chemical vapor deposition (PECVD). The applied carrier substrate 2 can for example be planarized by means of chemical mechanical polishing (CMP process). The application of the CMP process produces a planar carrier substrate surface 14, as represented in FIG. 2B.

Figure 2C:
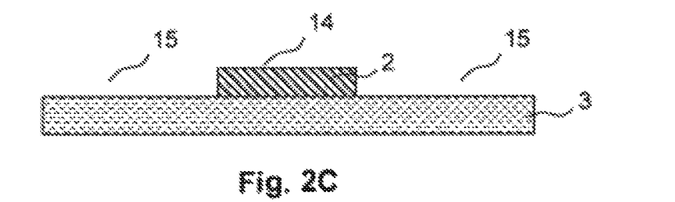
FIG. 2C the carrier substrate applied on the base substrate, said carrier substrate being structured.

FIG. 2C shows a structured carrier substrate 2, structuring in the context of this application meaning that the carrier substrate 2 is removed with the exception of any parts, which are supposed to remain as the carrier substrate 2. The carrier substrate 2 is structured preferably by means of a dry etching process, which allows very precise transfer of small mask structures. As is common with etching processes, a mask is firstly applied, which makes it possible to selectively carry out diffusion, ion implantation, etching or physical gas deposition on a layer located under the masking. A so-called hard mask is normally used, which for example consists of silicon dioxide or silicon nitride and, unlike photoresists, which are also used as masks, they are notably more resistant.

Figure 2D:
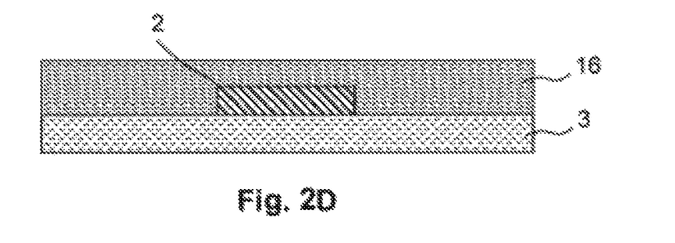
FIG. 2D the structure of the base substrate and structured carrier substrate, which is covered with a resistant layer.

FIG. 2D shows the structure according to FIG. 2C on which a resistant layer 16 is applied. Cavities 15 around the carrier substrate 2, or also cavities between individual carrier substrates 2 are filled with the resistant layer 16. The resistant layer material is preferably suitable for higher temperatures so that it can be applied by means of a sputtering process. The sputtering process belongs to physical vapour deposition (PVD) processes and has typical process temperatures in the range of 250° C. to 450° C.

Figure 2E:
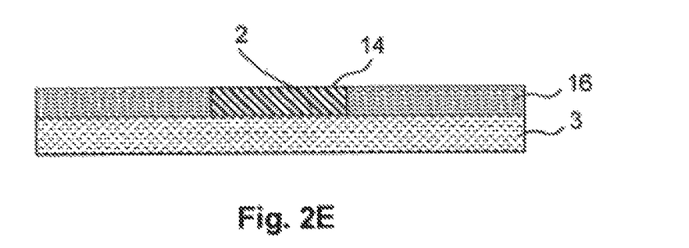
FIG. 2E the structure according to FIG. 2D in the case of which the resistant layer is ablated such that a plane of resistant layer and carrier substrate is formed.

As represented in FIG. 2E, the applied resistant layer 16 is processed such that it is planar to the surface 14 of the carrier substrate 2. This planarization is achieved by means of the CMP process (chemical mechanical polishing) already mentioned as an example.

Figure 2F:
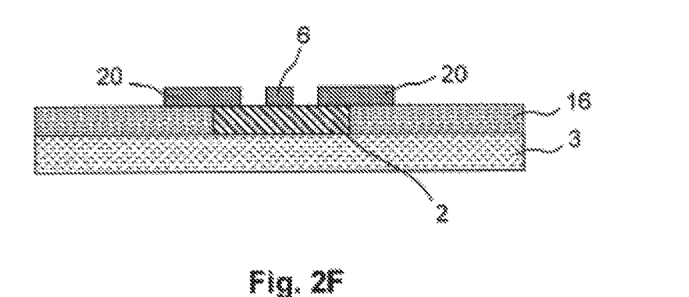
FIG. 2F the structure according to FIG. 2E in the case of which a contact layer is applied on the carrier substrate and in the case of which fastening elements are deposited on an outer region of the carrier substrate and resistant layer adjoined thereto.

FIG. 2F shows how at least one contact layer 6 and the fastening elements 20 are applied on the planarized surface, which is represented in FIG. 2E. This is preferably carried out by a conductive layer, preferably made of gold (Au) being applied on the planarized surface and then conductive layers, which are not required, being removed by corresponding processes. The fastening elements 20 are produced on an outer region of the carrier substrate 2 and the resistant layer adjoining thereto. The contact layer 6, from which for example a conductor path or an antenna element is produced by structuring, is preferably produced on the carrier substrate 2.

It is also conceivable for the contact layer 6 and/or the fastening elements 20 to be applied on the planarized surface by means of an additive process, preferably by galvanization processes.

Figure 2G:
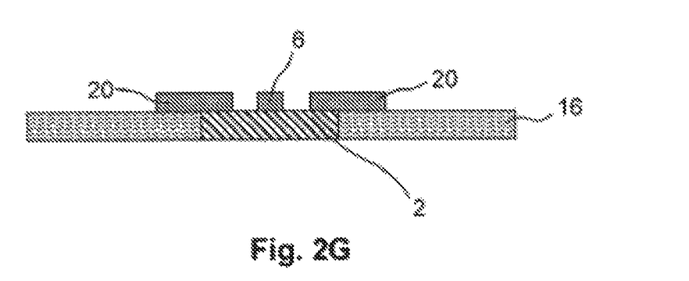
FIG. 2G the structure according to FIG. 2F in the case of which the base substrate is completely removed.

FIG. 2G shows the structure according to FIG. 2F in the case of which the base substrate 3 is completely removed. The base substrate 3 is removed by firstly ablating the base substrate 3 until just before the surface of the carrier substrate facing the base substrate 3, preferably by means of a mechanical method, for example by grinding the first base substrate layer 3. In order to avoid damaging the carrier substrate 2, ablation is not carried out all the way to the carrier substrate 2. The remainder of the base substrate 3 is then completely removed by means of a wet-chemical etching process. It must be ensured when selecting the wet-chemical etching process that the carrier substrate 2 is not damaged by the etching process. In order to avoid damaging the fastening elements 20 or the contact layer 6, it must be ensured that none of the chemical substances enter the contact layer with respect to the fastening elements during the etching process.

Figure 2H:
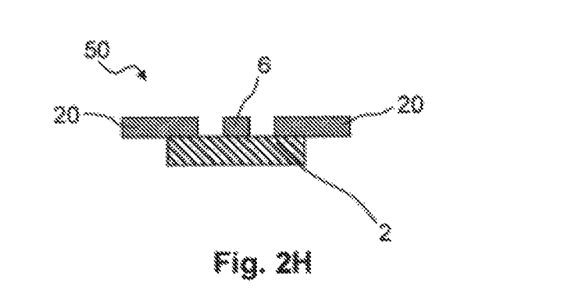
FIG. 2H the structure according to FIG. 2G in the case of which the resistant layer is also completely removed, whereby the HF substrate according to the invention is ultimately formed.

FIG. 2H lastly shows the HF substrate 50 according to the invention consisting of a carrier substrate 2, with two fastening elements 20 and at least one contact layer 6. This HF substrate 50 is obtained by the resistant layer, which is still present in FIG. 2G, being removed. It is removed by means of a dissolution process or by means of plasma incineration.

Plasma incineration is a process in semiconductor technology, which is used to remove organic layers and impurities by means of chemical reaction with plasma from reactive materials, such as oxygen or fluorine. This method is suitable for removing for example photoresist masks in order to clean wafers or even to remove the resistant layer 16.

The thickness of the contact layer 6 is e.g. 100 nm up to 500 nm. The thickness of the carrier substrate 2 is preferably 1 μm to 20 μm, further preferably 5 μm to 20 μm. The carrier substrate 2 is therefore notably thinner than the normal ceramic circuit carriers or the individual layers of a circuit board, which consist of individual films adhered to one another in each case.

The HF substrate 50 itself according to the invention can take any desired shape. Conceivable shapes are e.g. rectangular, square or L-shaped formations. However, circular or elliptical segments are also implementable. There are also no limits to length and width of the HF substrate 50, which is subsequently formed from the carrier substrate 2 and at least one fastening element 20 and at least one contact element 6.

The fastening elements 20 of the HF substrate according to the invention can for example be clamped and thus fixed into a hollow conductor. Heat from the HF substrate can be dissipated to the hollow conductor material via the fastening elements 20.

The FIGS. 3A to 3F show the individual method steps of a third exemplary embodiment for manufacturing the HF substrate 60 according to the invention.

Figure 3A:
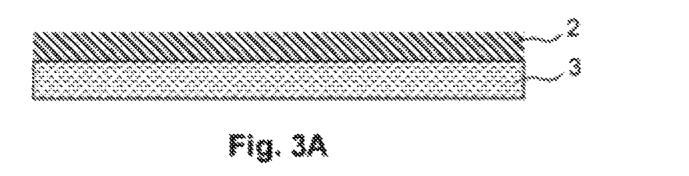
FIG. 3A a third exemplary embodiment for the alternative manufacture of the HF substrate according to the invention consisting of a first base substrate with applied carrier substrate.

FIG. 3A shows a first base substrate 3, which is required as the starting material, in order to provide the high-frequency (HF) substrate 60 according to the invention and which is already described in the preceding methods. A carrier substrate 2 is applied on the first base substrate 3 for example by means of a deposition process and planarized. The carrier substrate 2 is preferably diamond. Options for applying diamond on a base substrate and its preferences as the carrier substrate are already described in this document at another point.

Figure 3B:
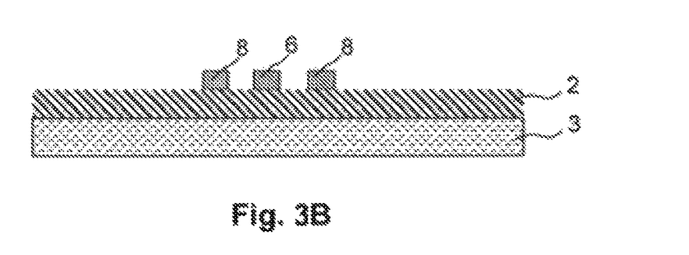
FIG. 3B the structure according to FIG. 3A in the case of which a contact layer is applied on the carrier substrate and in the case of which contact surfaces are deposited on the carrier substrate.

FIG. 3B shows a structured contact layer 6 applied on the carrier substrate 2, which preferably consists of gold (Au).

Structured contact layer 6 in the context of this application means that a contact layer 6, which is applied on the entire surface of the structure according to FIG. 3A (not represented), is removed with the exception of the part, which should form at least one conductor path and/or an antenna element.

The contact layer 6 can also be structured such that at least one part of the contact layer 6 is formed as a support surface to receive an electronic component. Any desired circuit with conductor paths, antenna elements, contact surfaces for components and further structures for carrying out signal processing processes for microwave applications can therefore be implemented on the carrier substrate.

Moreover, contact surfaces 8 for subsequently contacting fastening elements 20 are represented in FIG. 3B on the carrier substrate 2, which also preferably consist of gold (Au) and for example are produced by structuring a contact layer 6 or by application, for example by means of galvanization.

Figure 3C:
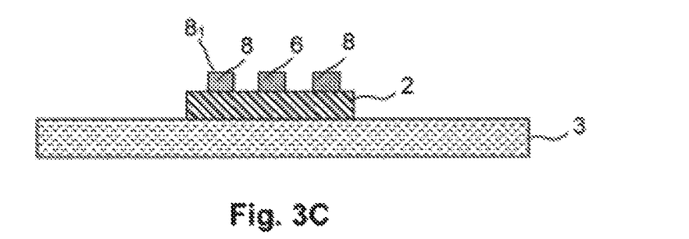
FIG. 3C the structure according to FIG. 3B in the case of which the carrier substrate is structured.

FIG. 3C shows the structure, which is already represented in FIG. 3B, the carrier substrate 2 now being structured. The structuring of a carrier substrate 2 has already been explained in this application, therefore no further detail will be given on it at this point. The structuring is carried out such that the contact surfaces 8 for subsequently contacting fastening elements 20 are formed on an outer region of the structured carrier substrate 2.

Figure 3D:
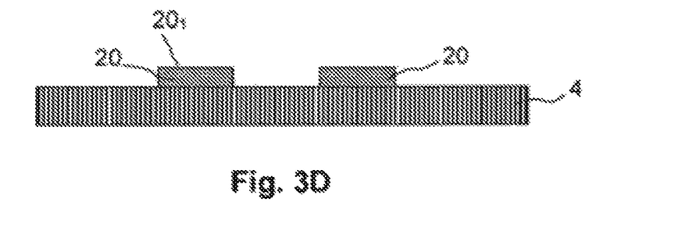
FIG. 3D a second base substrate on which two fastening elements are deposited.

FIG. 3D shows how the fastening elements 20 are applied on a second base substrate 4, the fastening elements 20 preferably consisting of gold (Au). Methods for applying fastening elements on a substrate are already described at another point in this document. The fastening elements 20 are positioned such that they lie on the contact surfaces 8, which are located on the first base substrate when the first base substrate 3 and the second base substrate 4 are placed on top of one another and are connected to one another.

Figure 3E:
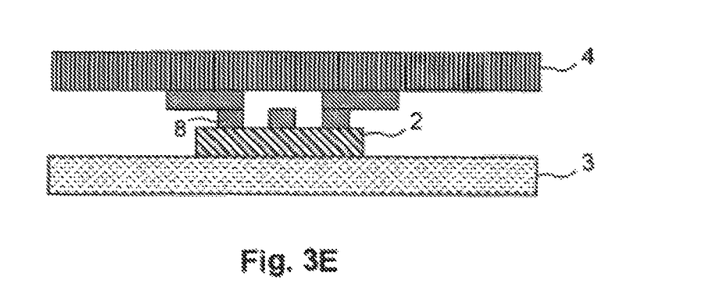
FIG. 3E a connection of the first base substrate and the second base substrate, the surface of the fastening elements lying on the contact surfaces.

FIG. 3E now shows the first base substrate 3 with structured carrier substrate 2. The outer region of the carrier substrate 2 has one contact surface 8 in each case. The surfaces $20_1$ of the fastening elements 20, which are applied on the second base substrate 4, lie on the surfaces $8_1$ of the contact surfaces 8 when both base substrates 3, 4 are placed on top of one another. The connection of the two base substrates and therefore of the fastening elements 20 to the contact surfaces 8 is carried out preferably by means of the thermo-compression process. In the case of this process, pressure and temperature are simultaneously applied to pairing surfaces in order to establish a bonding of the pairing surfaces.

Figure 3F:
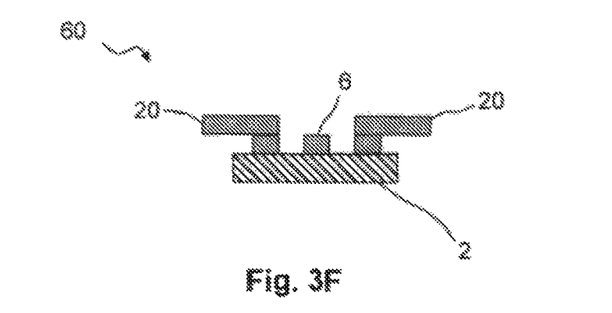
FIG. 3F the structure according to FIG. 3E in the case of which both the first and the second base substrate are completely removed.

In order to ultimately obtain the HF structure 60 according to the invention, both the first base substrate 3 and the second base substrate 4 are completely removed. To this end, mechanical processes already described are preferably used, such as grinding the substrates and/or mechanical and chemical processes, such as chemical mechanical polishing (CMP) or also a wet-chemical or dry-chemical etching process. In order that the substrate structures produced are not damaged when the base substrates 3, 4 are removed, the cavities between the connected base substrates 3 and 4 are filled by means of a protective layer (not represented). Calcium hydroxide (KOH) is preferably used here. The entire structure is therefore stabilized, which enables a grinding process, and fastening elements and contact surfaces are also protected against etching chemicals.

Figure 4:
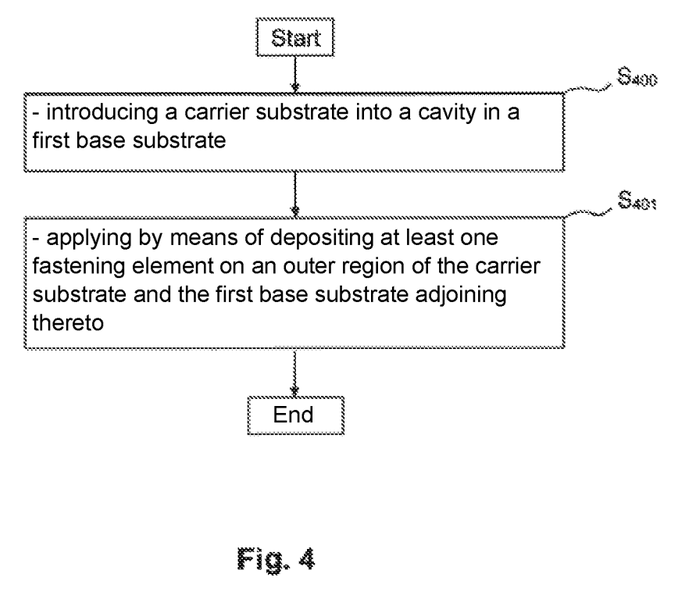
FIG. 4 an exemplary embodiment of a flow diagram for the method according to the invention for manufacturing the HF substrate.

After completely removing the first base substrate 3 and the second base substrate 4, the protective layer is also completely removed at the end. The HF substrate 60 according to the invention obtained in this manner is roughly identical to the HF substrates 1 and 50 according to the invention. Since the contact surfaces 8 on which the fastening elements 20 lie are preferably 0.1 μm to 0.5 μm thick, the HF substrate 60 according to the invention also has all preferences of the HF substrates 1 and 50. FIG. 4 shows an exemplary embodiment of a flow diagram for the method according to the invention for manufacturing the HF substrate 1.

In a first method step $S_{400}$, a carrier substrate 2 is introduced into a cavity of a base substrate 3. The cavity 5 is produced preferably with an etching process and the associated process steps.

In a second method step $S_{401}$, at least one fastening element 20 is applied by a deposition process on an outer region of the carrier substrate 2 and on the base substrate 3 adjoining thereto, the at least one fastening element protruding over the outer region of the carrier substrate 2 and lying on the base substrate 3. All known deposition processes such as e.g. PVD (physical vapor deposition) and galvanics are suitable for depositing the fastening element 20. The fastening elements 20 are also called beam leads.

Figure 5:
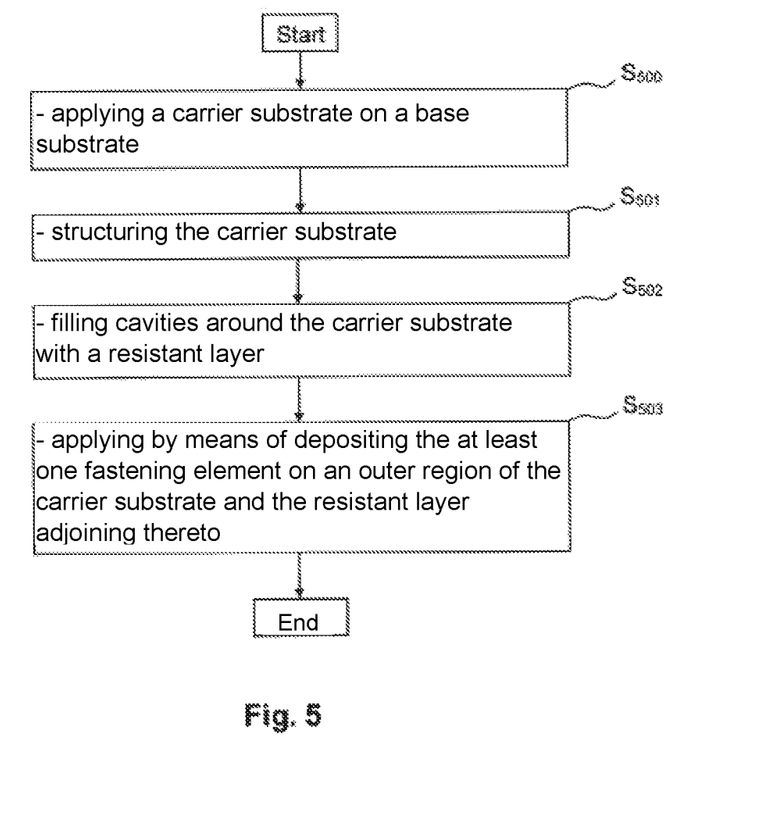
FIG. 5 a further exemplary embodiment of a flow diagram for an alternative method according to the invention for manufacturing the HF substrate.

FIG. 5 shows a further exemplary embodiment of a flow diagram for an alternative method according to the invention for manufacturing the HF substrate 50, which is identical to the HF substrate 1.

In a first method step $S_{500}$, a carrier substrate 2 is applied on a base substrate 3, preferably by means of the already mentioned PECVD process.

In a further method step $S_{501}$, the applied carrier substrate 2 is structured by any parts, which are not desired, being removed. A dry etching process is preferably used in order to be able to very precisely produce the desired carrier substrate structure(s).

In a subsequent method step $S_{502}$, cavities 15 around the carrier substrate 2, insofar as the carrier substrate 2 forms only one structure, or cavities inside a plurality of carrier substrate structures, insofar as the carrier substrate 2 forms a plurality of structures, are filled with a resistant layer 16. The resistant layer 16 is preferably applied by means of a physical gas deposition process, for example with the sputtering process.

Lastly, in a last method step $S_{503}$, at least one fastening element 20 is deposited on an outer region of the carrier substrate 2 and the resistant layer 16 adjoining thereto.

Figure 6:
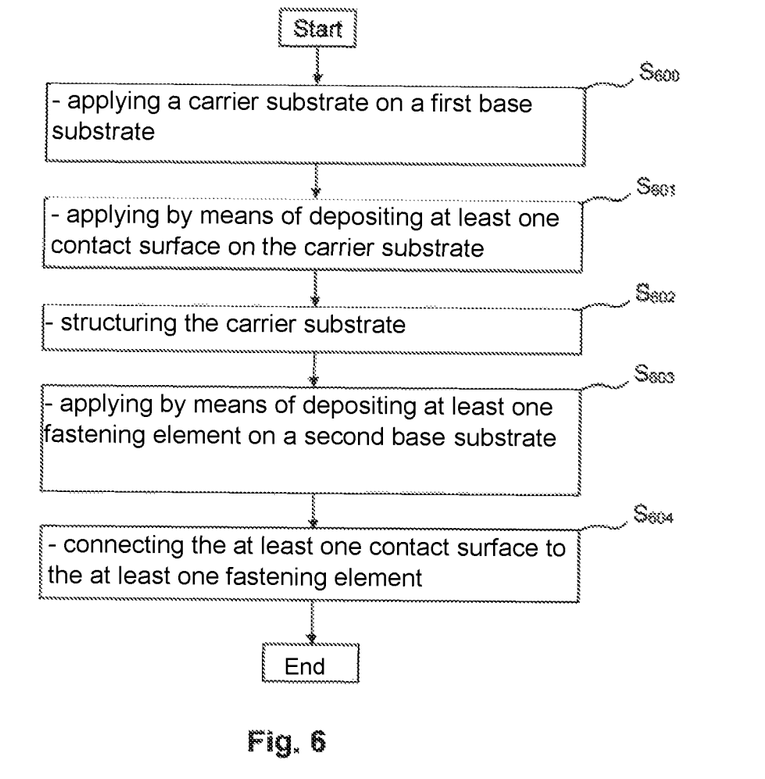
FIG. 6 a further exemplary embodiment of a flow diagram for an alternative method according to the invention for manufacturing the HF substrate.

FIG. 6 shows a further exemplary embodiment of a flow diagram for an alternative method according to the invention for manufacturing the HF substrate 60, which is roughly identical to the HF substrate 1 and to the HF substrate 50. The only difference is that the fastening elements 20 are not applied directly on the carrier substrate 2, but rather on the surface $8_1$ of a contact layer 8, which is applied on the carrier substrate. The contact layer 8 is preferably less than 1 μm thick, particularly preferably between 0.1 μm and 0.5 μm thick and is fixedly connected to the fastening element 20 by means of applying temperature and pressure.

In a first method step $S_{600}$, a carrier substrate 2 is applied on a first base substrate 3, preferably by means of the PECVD method already mentioned.

In a further method step $S_{601}$, at least one contact surface 8 is applied on the carrier substrate 2 by means of deposition. It is also conceivable for the entire surface of the carrier substrate 2 to firstly be metallized, preferably with gold (Au), the surface being structured by means of photolithography and a suitable etching process such that only the desired surfaces remain. The metallized surface is thus removed with the exception of the part, which forms the at least one contact surface 8.

In a subsequent method step $S_{602}$, the applied carrier substrate 2 is structured by the parts, which are not desired, being removed. A dry etching process is preferably used in order to be able to very precisely produce the desired carrier substrate structures. In order to avoid damaging the at least one contact surface 8 already produced, a hard mask is applied on the at least one contact surface 8.

In a subsequent method step $S_{603}$, at least one fastening element 20 is applied on a second base substrate 4 by means of deposition.

Lastly, in a last method step $S_{604}$, the at least one contact surface 8 is connected to the at least one fastening element 20. The first base substrate 3 and the second base substrate 4 are placed over one another such that the surface $20_1$ of the fastening element 20 lies on the surface $8_1$ of the contact surface 8. The surfaces lying on top of one another can be fixedly connected to one another by applying temperature and pressure.

In the context of the invention, all described and/or designated features and/or claimed features can be combined with one another as desired.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A method for manufacturing a high-frequency substrate with a carrier substrate and with at least one fastening element on an outer region of the carrier substrate, wherein the at least one fastening element protrudes over the outer region of the carrier substrate, wherein the method comprises the following steps:
   generating at least one cavity in a surface of the first base substrate;
   introducing the carrier substrate into the at least one cavity in the first base substrate;
   filling the cavity with the carrier substrate;
   removing excess carrier substrate such that only the cavity is completely filled with the carrier substrate; and
   depositing the at least one fastening element on an outer region of the carrier substrate and the first base substrate adjoining thereto.

2. A high-frequency substrate comprising a carrier substrate and at least one fastening element on an outer region of the carrier substrate, wherein the at least one fastening element protrudes over the outer region of the carrier substrate, wherein the high-frequency substrate is manufactured according to the steps of claim 1.

3. The method according to claim 1, further comprising:
   applying a contact layer on the carrier substrate, from which at least one conductor path and/or at least one antenna element is formed; and
   structuring the at least one conductor path and/or the at least one antenna element from the contact layer.

4. The method according to claim 3, wherein the carrier substrate comprises a diamond substrate and/or the carrier substrate comprises the contact layer comprising gold (Au).

5. The method according to claim 3, wherein the step of structuring further comprises:
   removing the contact layer with the exception of a part, which forms the at least one conductor path and/or the at least one antenna element.

6. The method according to claim 1, further comprising:
   applying a second base substrate on the first base substrate such that it lies on the at least one fastening element.

7. The method according to claim 6, further comprising:
   fixing the second base substrate on the first base substrate with an adhesive layer.

8. The method according to claim 1, further comprising:
   mechanically ablating the first base substrate until just before reaching the carrier substrate layer.

9. The method according to claim 8, further comprising:
   chemically ablating a remainder of the first base substrate; and/or
   completely ablating the second base substrate.

10. A method for manufacturing a high-frequency substrate with a carrier substrate and with at least one fastening element on an outer region of the carrier substrate, wherein the at least one fastening element protrudes over the outer region of the carrier substrate, wherein the method comprises the following steps:
    applying the carrier substrate on a first base substrate;
    depositing at least one contact surface on the carrier substrate;
    structuring the carrier substrate;
    depositing the at least one fastening element on a second base substrate;
    connecting the at least one contact surface to the at least one fastening element;
    by placing the first base substrate and the second base substrate on top of each other such that a first surface of the at least one contact surface of the first base substrate lies on a second surface of the at least one fastening element of the second base substrate; and
    fixing the first and second surfaces lying on top of each by applying temperature and pressure to the first and second surfaces.

11. A method for manufacturing a high-frequency substrate with a carrier substrate and with at least one fastening element on an outer region of the carrier substrate, wherein the at least one fastening element protrudes over the outer region of the carrier substrate, wherein the method comprises the following steps:
    applying the carrier substrate on a base substrate;
    structuring the carrier substrate;
    filling spaces on the base substrate around the carrier substrate with a resistant layer;
    uncovering an upper side of the carrier substrate from the resistant layer such that the resistant layer and the upper side of the carrier substrate form a planar surface; and
    depositing the at least one fastening element on the outer region of the carrier substrate and the resistant layer adjoining thereto.

12. The method according to claim 11, wherein the step of structuring the carrier substrate further comprises:
    removing a portion of the carrier substrate.

13. The method according to claim 11, further comprising:
    applying a contact layer on the carrier substrate from which at least one conductor path and/or at least one antenna element is formed; and
    structuring the at least one conductor path and/or the at least one antenna element.

14. The method according to claim 13, wherein the carrier substrate comprises a diamond substrate and/or the contact layer comprises gold (Au).

15. The method according to claim 13, wherein the step of structuring further comprises:
    removing the contact layer with the exception of a part, which forms the at least one conductor path and/or the at least one antenna element.

16. The method according to claim 11, further comprising:
    mechanically ablating the base substrate until just before reaching the carrier substrate layer.

17. The method according to claim 16, further comprising:
    chemically ablating a remainder of the base substrate; and/or
    completely ablating the resistant layer.

* * * * *